United States Patent
Sung et al.

(10) Patent No.: US 10,295,601 B2
(45) Date of Patent: *May 21, 2019

(54) METHOD AND APPARATUS FOR ESTIMATING STATE OF BATTERY

(71) Applicant: Samsung Electronics Co., Ltd., Suwon-si (KR)

(72) Inventors: Jaemo Sung, Hwaseong-si (KR); Jeonghyun Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 299 days.

This patent is subject to a terminal disclaimer.

(21) Appl. No.: 14/802,478

(22) Filed: Jul. 17, 2015

(65) Prior Publication Data

US 2016/0018472 A1   Jan. 21, 2016

(30) Foreign Application Priority Data

Jul. 18, 2014 (KR) .................. 10-2014-0091093

(51) Int. Cl.
  *G01R 31/36*   (2006.01)
  *B60L 11/18*   (2006.01)
  *G06K 9/00*    (2006.01)

(52) U.S. Cl.
  CPC ...... *G01R 31/3651* (2013.01); *B60L 11/1851* (2013.01); *B60L 11/1862* (2013.01); *G01R 31/3606* (2013.01); *G06K 9/00536* (2013.01)

(58) Field of Classification Search
  CPC ........... G01R 31/3651; G01R 31/3606; B60L 11/1851; B60L 11/1862; G06K 9/00536
  USPC ............................................... 702/63
  See application file for complete search history.

(56) References Cited

U.S. PATENT DOCUMENTS

| | | | |
|---|---|---|---|
| 7,032,080 B2* | 4/2006 | Mugitani | H04J 3/0652 370/438 |
| 8,168,315 B1 | 5/2012 | Hermann | |
| 8,178,227 B1 | 5/2012 | Hermann | |
| 2009/0027007 A1* | 1/2009 | Iwane | G01R 31/3651 320/129 |

(Continued)

FOREIGN PATENT DOCUMENTS

| CN | 101022178 A | 8/2007 |
|---|---|---|
| CN | 102749585 A | 10/2012 |

(Continued)

OTHER PUBLICATIONS

Hu, Xiaosong, et al. "Fuzzy clustering based multi-model support vector regression state of charge estimator for lithium-ion battery of electric vehicle." *Intelligent Human-Machine Systems and Cybernetics, 2009. IHMSC'09. International Conference on.* vol. 1. IEEE, 2009. (6 pages, in English).

(Continued)

*Primary Examiner* — Huan Hoang
(74) *Attorney, Agent, or Firm* — NSIP Law

(57) ABSTRACT

A battery state estimation apparatus includes a sensing data acquirer configured to acquire sensing data on a battery, and a battery state estimator configured to approximate the sensing data by mapping the sensing data to a predetermined feature space, and compare the approximated sensing data to predetermined reference information to estimate a state of the battery.

17 Claims, 17 Drawing Sheets

(56) References Cited

U.S. PATENT DOCUMENTS

| | | | |
|---|---|---|---|
| 2010/0106357 A1* | 4/2010 | Shin | G07C 5/0808 |
| | | | 701/31.4 |
| 2010/0188050 A1 | 7/2010 | Asakura et al. | |
| 2011/0191278 A1* | 8/2011 | Song | G01R 31/3651 |
| | | | 706/17 |
| 2012/0116722 A1 | 5/2012 | Yousfi-Steiner et al. | |
| 2013/0218496 A1* | 8/2013 | Koch | G01R 31/3651 |
| | | | 702/63 |
| 2013/0317771 A1* | 11/2013 | Laskowsky | G01R 31/3675 |
| | | | 702/63 |
| 2014/0009123 A1* | 1/2014 | Park | G01R 31/361 |
| | | | 320/152 |
| 2014/0152317 A1* | 6/2014 | Baraszu | G01N 27/416 |
| | | | 324/433 |
| 2014/0333317 A1* | 11/2014 | Frost | G01R 31/3606 |
| | | | 324/430 |
| 2016/0238667 A1* | 8/2016 | Palmisano | B60R 16/023 |

FOREIGN PATENT DOCUMENTS

| | | | |
|---|---|---|---|
| DE | 102010040451 A1 | 3/2012 | |
| EP | 1115171 A1 | 7/2001 | |
| EP | 1691209 A1 | 8/2006 | |
| JP | 59-77367 A | 5/1984 | |
| JP | 2009-73465 A | 4/2009 | |
| JP | 2009-98970 A | 5/2009 | |
| JP | 5114884 B2 | 1/2013 | |
| JP | 2014-059270 A | 4/2014 | |
| KR | 10-2009-0057300 A | 6/2009 | |
| KR | 10-2013-0090861 A | 8/2013 | |
| WO | WO 2009/158225 A2 | 12/2009 | |

OTHER PUBLICATIONS

Extended European Search Report dated Nov. 26, 2015 in Counterpart European Patent Application No. 15176229.1 (10 pages, in English).

Chinese Office Action dated Aug. 29, 2018 in corresponding Chinese Patent Application No. 201510420335.3 (14 pages in English, 9 pages in Chinese).

Chinese Office Action dated Mar. 27, 2019 in Corresponding Chinese Patent Application No. 201510420335.3 (14 pages in English, 10 pages in Chinese).

* cited by examiner

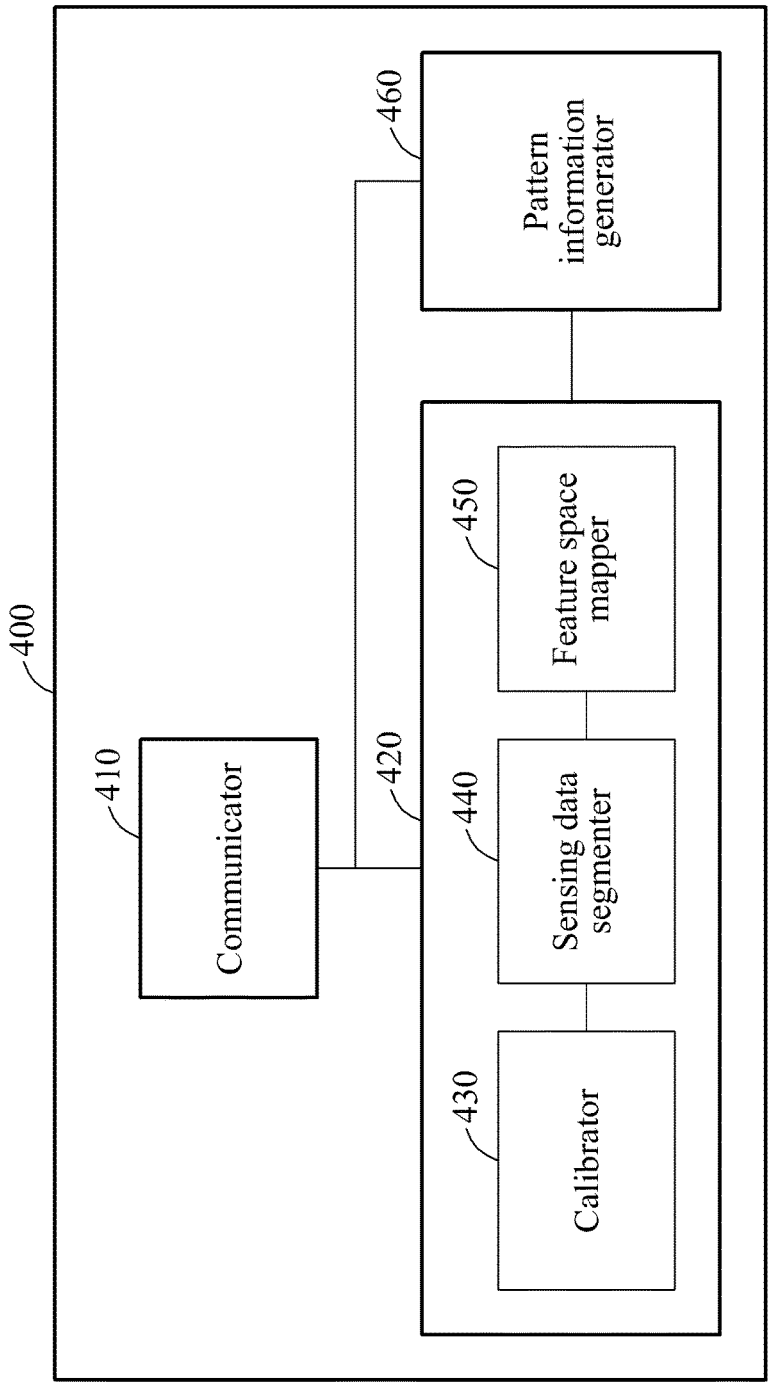

FIG. 6
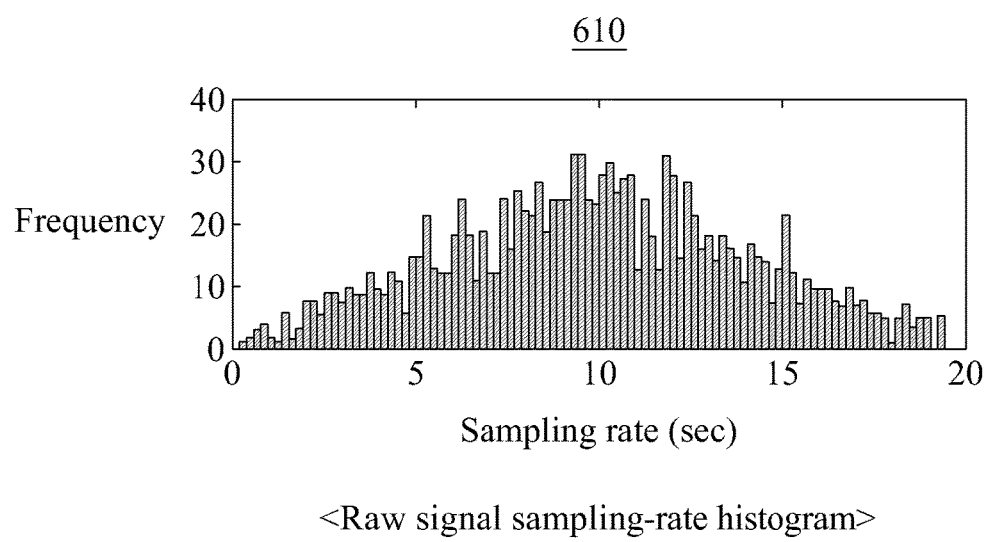
<Raw signal sampling-rate histogram>
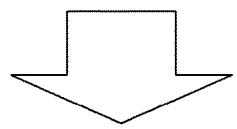
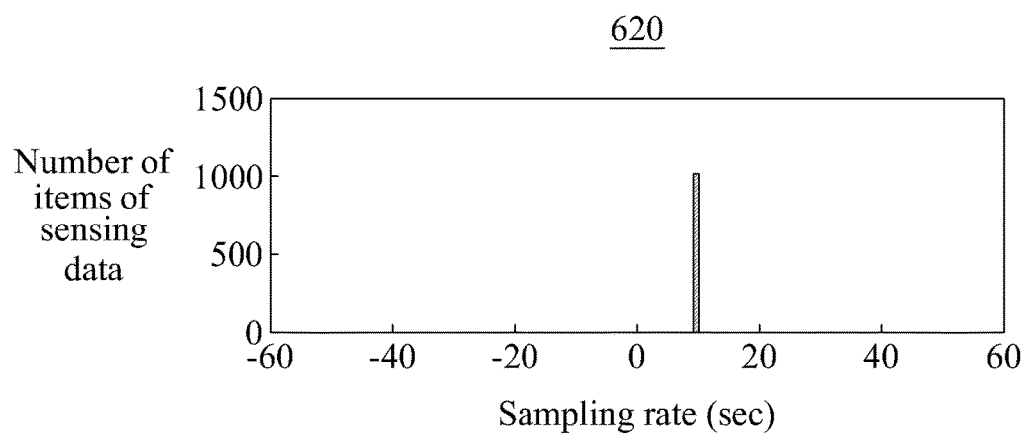

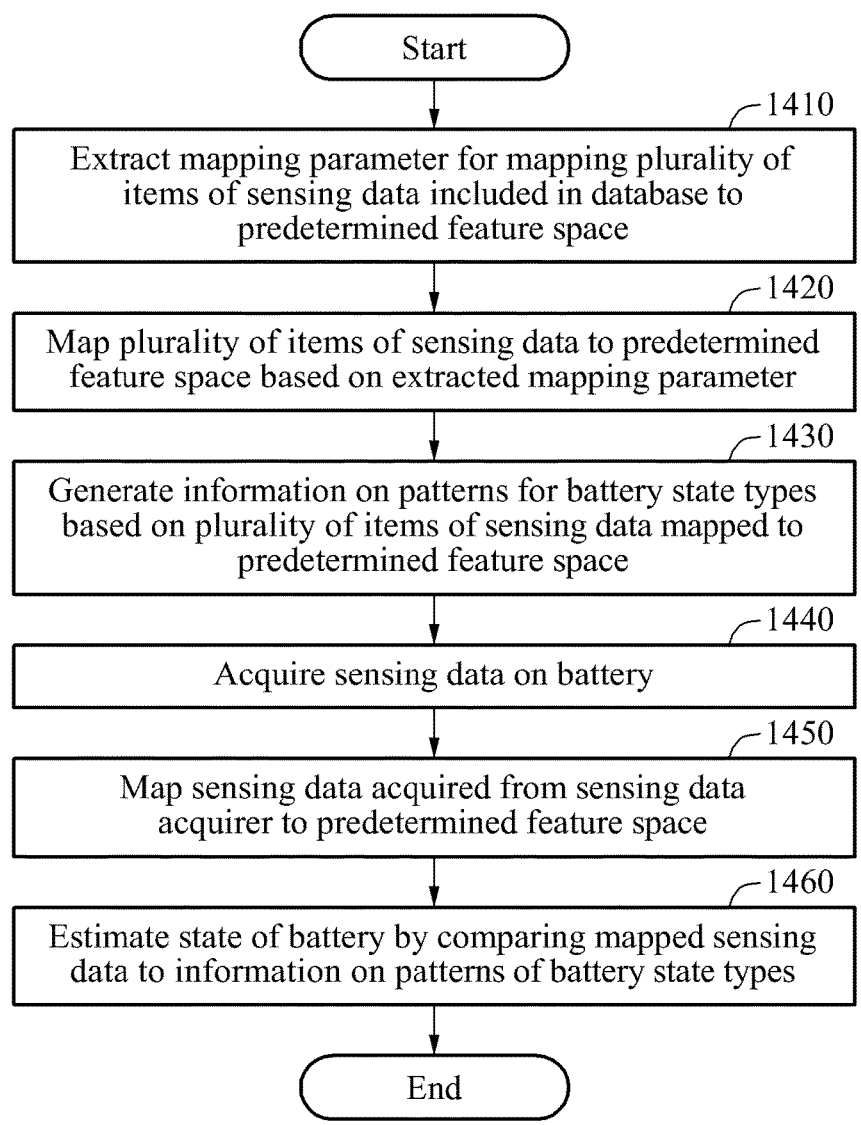

METHOD AND APPARATUS FOR ESTIMATING STATE OF BATTERY

CROSS-REFERENCE TO RELATED APPLICATION(S)

This application claims the benefit under 35 USC 119(a) of Korean Patent Application No. 10-2014-0091093 filed on Jul. 18, 2014, in the Korean Intellectual Property Office, the entire disclosure of which is incorporated herein by reference for all purposes.

BACKGROUND

1. Field

The following description relates to a method and apparatus for estimating a state of a battery.

2. Description of Related Art

As environmental concerns and energy resource issues become more important, an electric vehicle (EV) has been highlighted as a vehicle of the future. The EV does not emit exhaust gas, and produces much less noise than a vehicle with a combustion engine because a battery constituted by a single pack of a plurality of rechargeable and dischargeable secondary cells is used as a main power source in the EV.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a battery state estimation apparatus includes a sensing data acquirer configured to acquire sensing data on a battery; and a battery state estimator configured to approximate the sensing data by mapping the sensing data to a predetermined feature space, and compare the approximated sensing data to predetermined reference information to estimate a state of the battery.

The battery state estimator may include a sensing data segmenter configured to segment the sensing data based on a predetermined time interval, extract a segment having a predetermined size from each time interval, and generate a segment vector including the segment.

The battery state estimator may further include a calibrator configured to correct a time error of the sensing data based on a predetermined calibration cycle as a reference.

The battery state estimator may further include a feature space mapper configured to map the segment vector to the predetermined feature space based on a predetermined mapping parameter.

The predetermined mapping parameter may include a predetermined reference matrix; and the feature space mapper may be further configured to project the segment vector onto the predetermined reference matrix to extract a feature vector having a dimension corresponding to the predetermined feature space.

The predetermined reference information may include information on patterns for battery state types in the predetermined feature space; and the battery state estimator may further include a battery state determiner configured to determine the state of the battery by comparing the feature vector to the information on the patterns.

The battery state types may include a normal state type, an abnormal state type, and a fault state type; and each of the abnormal state type and the fault state type may include at least one subtype.

The battery state determiner may be further configured to calculate a similarity between the feature vector and each of the patterns in the predetermined feature space, and determine the state of the battery based on a comparison between the calculated similarities.

The battery state estimator may be further configured to receive the predetermined reference information and the predetermined mapping parameter from an external preprocessing apparatus configured to determine the predetermined reference information and the predetermined mapping parameter from sensing data on the battery separate from the sensing data acquired by the sensing data acquirer.

The external preprocessing apparatus may be further configured to update the predetermined reference information based on additional sensing information of the battery; the battery state estimator may be further configured to receive the updated predetermined reference information from the external preprocessing apparatus; and the battery state estimator may be further configured to compare the approximated sensing data to predetermined reference information to estimate the state of the battery.

In another general aspect, the battery state estimation method includes acquiring sensing data on a battery; approximating the sensing data by mapping the sensing data to a predetermined feature space; and comparing the approximated sensing data to predetermined reference information to estimate a state of the battery.

The approximating may include segmenting the sensing data based on a predetermined time interval; extracting a segment having a predetermined size from each time interval; and generating a segment vector including the segment.

The approximating may further include correcting a time error of the sensing data based on a predetermined calibration cycle as a reference.

The approximating may further include mapping the segment vector to the predetermined feature space based on a predetermined mapping parameter.

The predetermined mapping parameter may include a predetermined reference matrix; and the mapping may include projecting the segment vector onto the predetermined reference matrix to extract a feature vector having a dimension corresponding to the predetermined feature space.

The predetermined reference information may include information on patterns for battery state types in the predetermined feature space; and the approximating may further include determining the state of the battery by comparing the feature vector to the information on the patterns.

The battery state types may include a normal state type, an abnormal state type, and a fault state type; and each of the abnormal state type and the fault state type may include at least one subtype.

The determining may include calculating a similarity between the feature vector and each of the patterns in the predetermined feature space; and determining the state of the battery based on a comparison between the calculated similarities.

The method may further include receiving the predetermined reference information and the predetermined mapping parameter from an external preprocessing apparatus configured to determine the predetermined reference information and the predetermined mapping parameter from sensing data on the battery separate from the sensing data acquired by the sensing data acquirer.

The external preprocessing apparatus may be further configured to update the predetermined reference information based on additional sensing information of the battery; the method may further include receiving the updated predetermined reference information from the external preprocessing apparatus; and the comparing may include comparing the approximated sensing data to the updated predetermined reference information to estimate the state of the battery.

In another general aspect, a non-transitory computer-readable storage medium stores instructions for causing a computer to perform the method of claim described above.

In another general aspect, a preprocessing apparatus for a battery state estimation apparatus includes an approximator configured to approximate sensing data on a battery by mapping the sensing data to a feature space; a pattern information generator configured to generate, from the sensing data mapped to the feature space, reference information to be used by the battery state estimation apparatus in estimating a state of a battery; and a communicator configured to transmit the reference information to the battery state estimation apparatus.

The approximator may be further configured to determine a mapping parameter from the sensing data, and map the sensing data to the feature space based on the mapping parameter; and the communicator may be further configured to transmit the mapping parameter to the battery state estimation apparatus for use by the battery estimation apparatus in estimating the state of the battery.

The mapping parameter may include a reference matrix; and the approximator may be further configured to project the sensing data onto the reference matrix to extract a feature vector having a dimension corresponding to the feature space.

The approximator may be further configured to approximate additional sensing data on a battery by mapping the additional sensing data to the feature space; the pattern information generator may be further configured to generate, from the sensing data mapped to the feature space and the additional sensing data mapped to the feature space, updated reference information to be used by the battery state estimation apparatus in estimating the state of the battery; and the communicator may be further configured to transmit the updated reference information to the battery state estimation apparatus.

Other features and aspects will be apparent from the following detailed description, the drawings, and the claims.

BRIEF DESCRIPTION OF THE DRAWINGS

FIG. 4 is a block diagram illustrating an example of a preprocessing apparatus for estimating a state of a battery.

FIG. 6 is a diagram illustrating an example of calibration.

FIG. 14 is a flowchart illustrating another example of a battery state estimation method.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The terminology used herein is for the purpose of describing particular examples only, and is not intended to limit the disclosure. As used herein, the singular forms "a," "an," and "the" are intended to include the plural forms as well, unless the context clearly indicates otherwise. The terms "include" and "have," when used in this specification, specify the presence of stated features, numbers, operations, elements, components, or combinations thereof, but do not preclude the presence or addition of one or more other features, numbers, operations, elements, components, or combinations thereof.

Unless otherwise defined, all terms, including technical and scientific terms, used herein have the same meaning as commonly understood by one of ordinary skill in the art to which this disclosure pertains. Terms, such as those defined in commonly used dictionaries, should be interpreted as having a meaning that is consistent with their meaning in the context of the relevant art. and are not to be interpreted in an idealized or overly formal sense unless expressly so defined herein.

Figure 1:
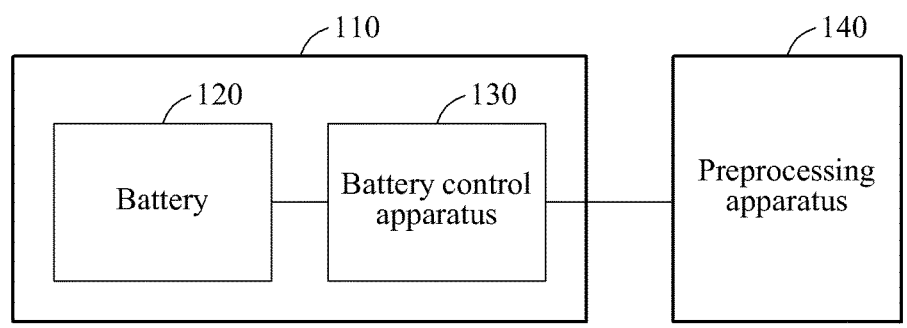
FIG. 1 is a block diagram illustrating an example of a battery system and a preprocessing apparatus.

FIG. 1 is a block diagram illustrating an example of a battery system 110 and a preprocessing apparatus 140.

Referring to FIG. 1, the battery system 110 includes a battery 120 and a battery control apparatus 130, for example, a battery management system (BMS). The battery 120 supplies power to a vehicle, for example an electric vehicle (EV), including the battery system 110, and includes a plurality of battery modules. Each of the plurality of battery modules includes a plurality of cells. The plurality of battery modules may be connected to one another in parallel, in series, or a combination of both. In one example, the plurality of battery modules are secondary batteries, for example, lithium-ion batteries. Also, a capacity of each of the plurality of battery modules may be the same as or different from one another. The battery system 110 may be referred to as an energy storage system (ESS).

The battery control apparatus 130 monitors a state of the battery 120 and controls the battery 120. The battery control apparatus 130 performs a thermal control of the plurality of battery modules in the battery 120. Also, the battery control apparatus 130 prevents the battery 120 from being overcharged and overdischarged, and controls the plurality of battery modules to be in equal charge states by performing cell balancing. Accordingly, an energy efficiency of the battery 120 will increase, and a life of the battery 120 will be extended.

Also, the battery control apparatus 130 estimates state of health (SOH) information, state of charge (SOC) information, state of function (SOF) information, and other information of the plurality of battery modules. The SOH information indicates a degree of degradation in a performance of the battery 120 compared to a performance of the battery 120 when it was manufactured. The SOC information is information on an amount of charge stored in the battery 120, and the SOF information is information on a degree to which the performance of the battery 120 matches a predetermined condition.

The battery control apparatus 130 may provide the SOH information, the SOC information, and the SOF information to an electronic control unit (ECU). In one example, the battery control apparatus 130 may communicate with the ECU using a controller area network (CAN) communication.

The battery control apparatus 130 estimates the state of the battery 120 based on sensing data on the battery 120. States of the battery 120 include a normal state, an abnormal state, and a fault state. In the normal state, the battery 120 is able perform a normal function. In the abnormal state, the battery 120 is operable but unable to perform the normal function. In the fault state, the battery 120 is not able to perform an operation. For example, the abnormal state and the fault state may include overcharging, overdischarging, thermal runaway, explosion, contact error, current reduction, and other malfunctions of the battery 120. Also, the abnormal state and the fault state may be caused by diverse factors. For example, the abnormal state and the fault state may be caused by an error factor such as an internal chemical reaction state based on a type of the battery 120, a surrounding environment including a temperature and a humidity of the battery 120, a charging and discharging history of the battery 120, and other factors.

In one example, the battery control apparatus 130 acquires sensing data on the battery 120, approximates the acquired sensing data, and estimates the state of the battery 120 by comparing the approximated sensing data to predetermined reference information. The sensing data may include any one or any combination of any two or more of voltage data, current data, temperature data, and pressure data on the battery 120. The battery control apparatus 130 segments the sensing data based on a predetermined time interval and a predetermined size, and maps the segmented sensing data to a predetermined feature space. The predetermined reference information is acquired by the preprocessing apparatus 140, and includes information on patterns for types of the state of the battery 120. The battery control apparatus 130 determines the state of the battery 120 by comparing the mapped sensing data to the information on the patterns. This enables the battery control apparatus 130 to estimate the state of the battery 120 in real time irrespective of, for example, the type of the battery 120 and the error factor of the battery 120. Also, the battery control apparatus 130 may estimate a state with respect to a battery pack level unit and a battery cell level unit as well as a battery level unit.

The preprocessing apparatus 140 provides information for estimating the state of the battery 120 to the battery control apparatus 130. In FIG. 1, although the preprocessing apparatus 140 is shown as being separate from the battery system 110, the preprocessing apparatus 140 may also be included in the battery system 110 in another example. For example, the preprocessing apparatus 140 may be implemented externally to the battery system 110 through a personal computer (PC), a server, or a cloud. The preprocessing apparatus 140 may also be implemented internally to the battery system 110 in a form of a module.

The preprocessing apparatus 140 extracts a mapping parameter for approximating a plurality of items of sensing data included in a database (not shown), approximates the plurality of items of sensing data based on the extracted mapping parameter, and generates information on patterns for types of the state of the battery 120 based on a result of the approximating. The preprocessing apparatus 140 transmits and receives data to and from the battery control apparatus 130 using a wired interface or a wireless interface. Subsequently, the preprocessing apparatus 140 transmits the information on the patterns to the battery control apparatus 130. Since the battery control apparatus 130 acquires the information on the patterns in advance, the battery control apparatus 130 is able to estimate the state of the battery 120 using a reduced number of operations and time. In one example, the preprocessing apparatus 140 periodically updates the information on the patterns, or updates the information on the patterns based on a predetermined rule. For example, in response to inputting new sensing data to the database, the preprocessing apparatus 140 updates the information on the patterns with the new sensing data on the battery 120.

Figure 2:
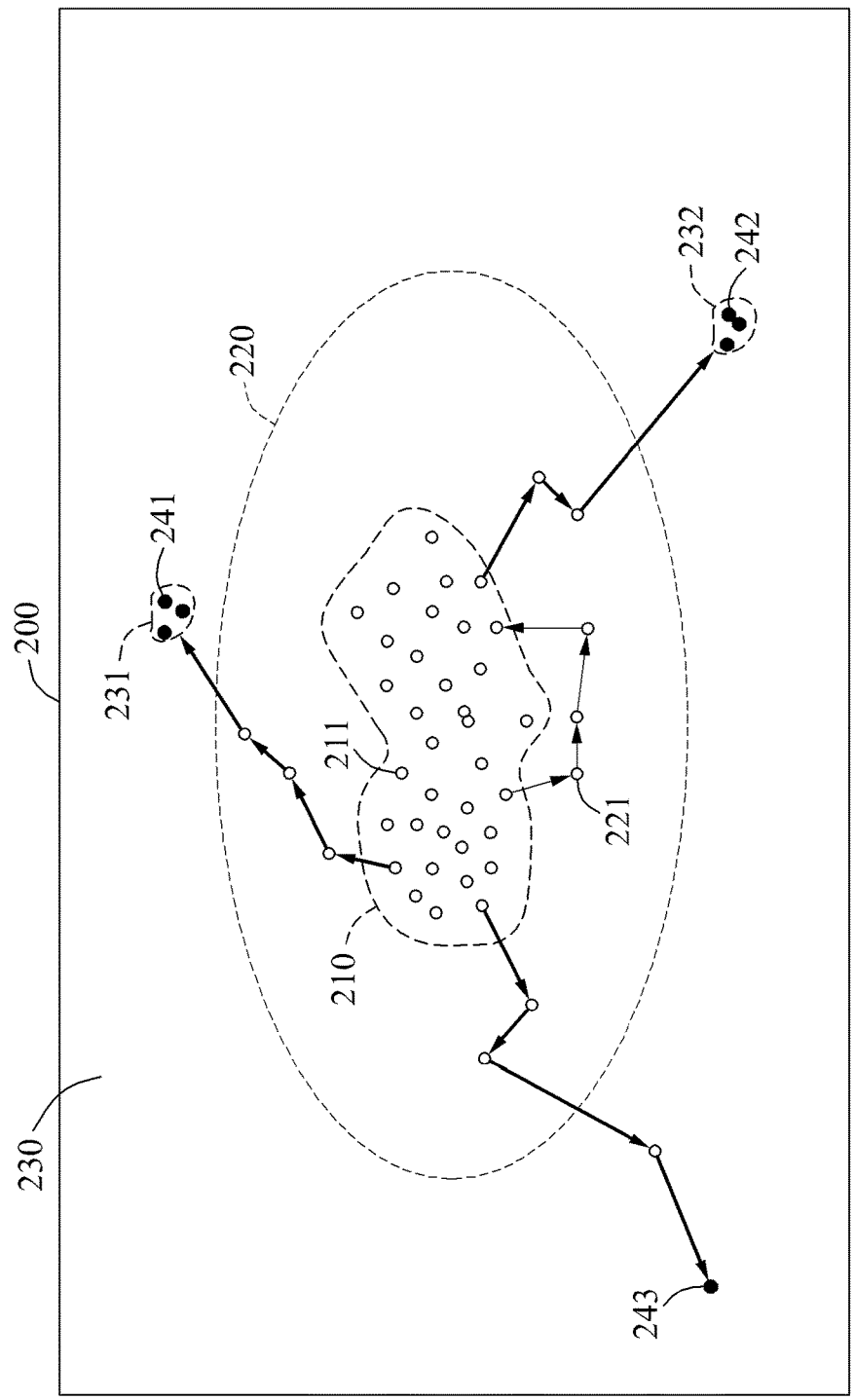
FIG. 2 is diagram illustrating an example of a state of a battery.

FIG. 2 is diagram illustrating an example of a state of a battery.

Referring to FIG. 2, the state of the battery may be expressed by a plurality of areas as indicated by a battery state area 200. The battery state area 200 is classified into a normal state area 210, an abnormal state area 220, and a fault state area 230. In the normal state area 210, a battery 211 is able to perform a normal function. In the abnormal state area 220, a battery 221 is operable but unable to perform the normal function. In the fault state area 230, batteries 241, 242, and 243 are not able to perform an operation. In FIG. 2, the battery 221 in the abnormal state area 220 is originally located in the normal state area 210 at a time of manufacture. After a predetermined time elapses, the battery 221 is relocated to the abnormal state area 220. When an error factor causing the battery 221 to be located in the abnormal state area 220 is eliminated, the battery is relocated to the normal state area 210 again.

The fault state area 230 includes detail areas including a first detail area 231 and a second detail area 232. Each of the detail areas indicates one of a plurality of fault states. For example, the first detail area 231 indicates a state of a battery fully discharged, and the detail area 232 indicates a state of a battery damaged by a thermal runaway. A presence of the battery 241 in the first detail area 231 indicates that the battery 241 is fully discharged, and a presence of the battery 242 in the second area 232 indicates that the battery 242 is damaged by a thermal runaway. A presence of the battery 243 in an area of the fault state area 230 other than the first detail area 231 and the second detail area 232 indicates that the battery 243 is inoperable and a fault type of the battery 243 is not recognized.

Figure 3:
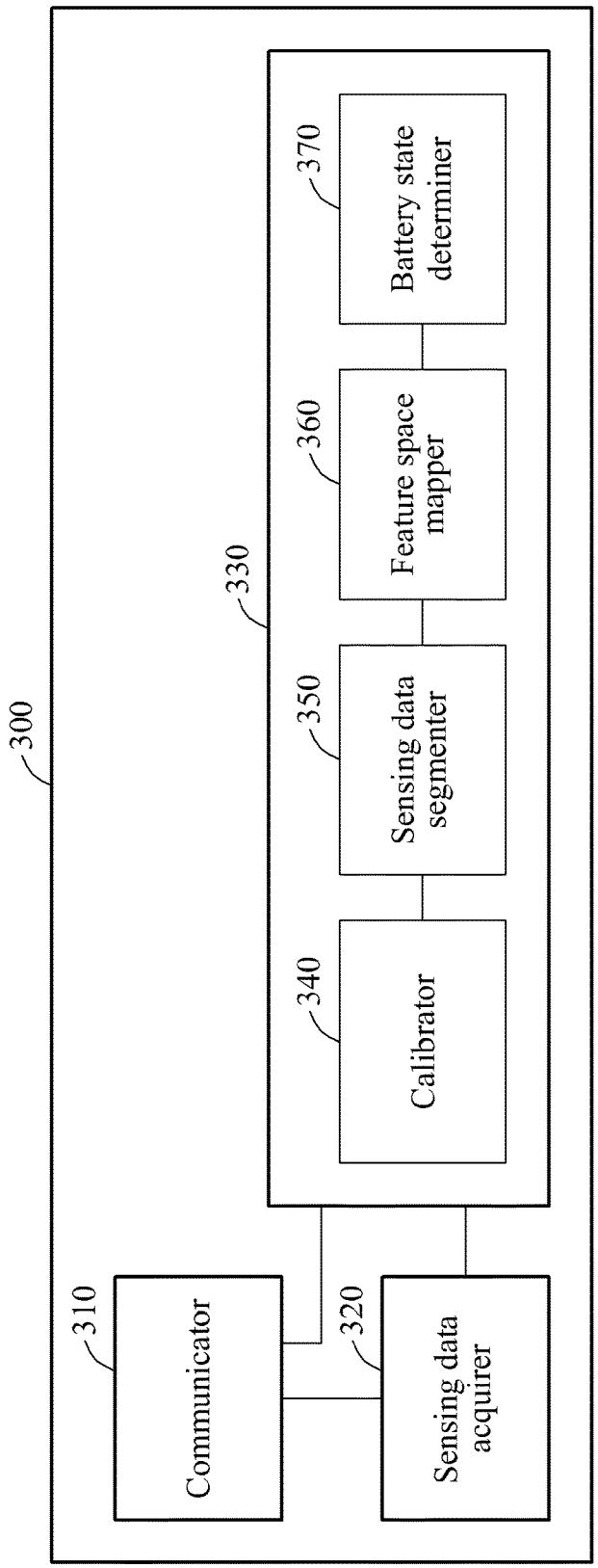
FIG. 3 is a block diagram illustrating an example of a battery state estimation apparatus.

FIG. 3 is a block diagram illustrating an example of a battery state estimation apparatus.

Referring to FIG. 3, a battery state estimation apparatus 300 includes a communicator 310, a sensing data acquirer 320, and a battery state estimator 330. In one example, the battery state estimation apparatus 300 corresponds to the battery control apparatus 130.

The communicator 310 transmits and receives and data to and from an external source using a wired interface or a wireless interface. In this example, the external source may be any device other than the battery state estimation apparatus 300. For example, the communicator 310 transmits and receives data to and from a predetermined apparatus of a vehicle including the battery state estimation apparatus 300 using the wired interface. The communicator 310 may also transmit and receive the data to and from an external apparatus, for example, a server and a cloud, of the vehicle including the battery state estimation apparatus 300 using the wireless interface.

The sensing data acquirer 320 acquires sensing data on a battery. The sensing data may include any one or any combination of any two or more of voltage data, current data, temperature data, and pressure data on the battery, each sensed by a sensor used to sense the battery. The sensing data may be time series data sensed based on a predetermined time interval, for example, a sampling time, during a predetermined time period. For example, a voltage sensor may sense a voltage of the battery at each one-second time interval during ten seconds under a control of the sensing data acquirer 320, and the sensing data acquirer 320 receives the sensing data from the voltage sensor. The sensing data acquirer 320 provides the acquired sensing data to the battery state estimator 330 or the communicator 310.

The battery state estimator 330 approximates the sensing data, and estimates a state of the battery by comparing the approximated sensing data to predetermined reference information. In the example in FIG. 3, the battery state estimator 330 includes a calibrator 340, a sensing data segmenter 350, a feature space mapper 360, and a battery state determiner 370.

The calibrator 340 corrects a time error of the sensing data based on a predetermined calibration cycle as a reference. When the sensing data acquirer 320 acquires the sensing data, sensing may be delayed depending on a state of the sensor, and sensing times among sensors may not be synchronized depending on a network state among the sensors. Thus, despite the controlling of the sensing data acquirer 320, each of the sensors may sense the battery during a different cycle or at a different time. When a plurality of sensing values included in raw sensing data acquired by the sensing data acquirer do not correspond to the predetermined calibration cycle, the calibrator 340 corrects a time error of the raw sensing data. For example, the calibrator 340 corrects a sampling rate of the raw sensing data at equal intervals based on a predetermined sampling rate as a reference. In one example, the calibrator 340 receives information on a calibration parameter, such as the predetermined calibration cycle, from an external source, for example, a preprocessing apparatus, using a communicator 310.

In one example, the calibrator 340 adjusts the calibration cycle. For example, if a sampling rate of the sensor is set at 0.1 seconds, not all of the data may be used even though the acquirer 320 acquires data at an interval of 0.1 seconds. If performance of the battery state estimation apparatus 300 will not be degraded by changing the sampling rate to 0.2 seconds, the calibrator 340 may set the calibration cycle as 0.2 seconds to calibrate the sensing data. This reduces a dimension of the sensing data by half, thereby reducing a number of operations performed by the battery state estimation apparatus 300.

In one example, the calibrator 340 corrects the raw sensing data based on a calibration scheme such as an interpolation scheme, a merging scheme, or an averaging scheme. For example, in the interpolation scheme, the calibrator 340 interpolates a plurality of sensing values based on the predetermined calibration cycle and an assumption that a plurality of sensing values included in the raw sensing data are linear, and sets a sensing value corresponding to the predetermined calibration cycle. As another example, when the merging scheme is used, the calibrator 340 sets a sensing value corresponding to a time most temporally adjacent, i.e., closest in time, to the predetermined calibration cycle as a sensing value corresponding to the predetermined calibration cycle. As still another example, when the averaging scheme is used, the calibrator 340 sets an average value of sensing values corresponding to times temporally adjacent to the predetermined calibration cycle as the sensing value corresponding to the predetermined calibration cycle. Further descriptions about the interpolation scheme, the merging scheme, and the averaging scheme will be provided with reference to FIG. 5A through 5C.

In one example, in response to an increase in a time period for sensing the sensing data, a dimension on a time axis of the sensing data increases. In response to the increase in the dimension, a number of operations needed to process the sensing data correspondingly increases. Also, depending on a property of the battery, sensing data sensed using a reduced amount of time may be preferably used to estimate the state of the battery. To this end, the sensing data segmenter 350 segments the sensing data based on a segment interval and a segment size. The segment interval and the segment size may be determined in advance. In one example, the sensing data segmenter 350 segments the sensing data based on the segment interval, extracts a segment having the segment size from each interval of the segmented sensing data, and generates a segment vector including each extracted segment. This enables the sensing data to be segmented into a form of a dimension having a same size and information on a same time interval, and thus a reliability of the state of the battery estimated by the battery state estimator 330 may be improved. The segment vector may be used as a basic unit for the estimating of the state of the battery performed by the battery state estimator 330.

When the sensing data includes at least two items of data among the voltage data, the current data, the temperature data, and the pressure data, the sensing data segmenter 350 extracts segments for the at least two items of data, generates data blocks corresponding to the at least two items of data based on the extracted segments, and generates a segment vector by combining the data blocks. For example, when the sensing data includes the voltage data and the pressure data, the sending data segmenter 350 segments each of the voltage data and the pressure data based on the segment interval, and extracts a segment having the segment size from each interval corresponding to a result of the segmenting. The sensing data segmenter 350 generates a voltage data block including the segment of the voltage data and a pressure data block including the segment of the pressure data, and generates a segment vector by combining the voltage data block and the pressure data block.

In one example, the sensing data segmenter 350 adjusts a segment parameter such as the segment interval and the segment size used to segment the sensing data. This enables a quantity of information included in the segment vector and a speed of generating the segment vector to be adjusted. For example, the sensing data segmenter 350 sets the segment parameter, and also receives information on the segment parameter from the external source, for example, a preprocessing apparatus, using the communicator 310. Also, the segment interval corresponds to a time period during which the battery state estimator 330 estimates the state of the battery. For example, when the segment interval is set to five minutes, the battery state estimator 330 estimates the state of the battery at five minute intervals.

The feature space mapper 360 maps the segment vector to a predetermined feature space based on a predetermined mapping parameter. The feature space is a low-dimensional space for expressing the sensing data. As an example, the feature space mapper 360 sets the predetermined mapping parameter, and also receives the information on the predetermined mapping parameter from the external source, for example, the preprocessing apparatus, using the communicator 310. By mapping the segment vector to the predetermined feature space, high-dimensional data may be compressed into a low-dimensional orthogonal space, Accordingly, the number of operations needed for estimating the state of the battery in the battery state estimator 330 may be reduced.

In one example, the predetermined mapping parameter includes a predetermined reference matrix. The feature space mapper 360 maps the segment vector to the predetermined feature space by projecting the segment vector onto the predetermined reference matrix, and extracts a feature vector having a dimension corresponding to the predetermined feature space. For example, the feature space mapper 360 acquires a principal component analysis (PCA) basis matrix from the preprocessing apparatus, and maps the segment vector to a PCA feature space by projecting the segment vector onto the PCA basis matrix. As another example, the feature space mapper 360 acquires a linear discriminant analysis (LDA) base matrix from the preprocessing apparatus, and maps the segment vector to an LDA feature space by projecting the segment vector onto the LDA basis matrix.

The battery state estimator 330 estimates the state of the battery by comparing the feature vector mapped to the predetermined feature space with predetermined reference information. The predetermined reference information includes information on patterns for battery state types in the predetermined feature space. In one example, the predetermined reference information includes a data pattern for each of a normal state type, an abnormal state type, and a fault state type quantified in the predetermined feature space. In another example, each of the abnormal state type and the fault state type include at least one subtype, and the predetermined reference information includes a data pattern for each of the at least one subtype. Examples of subtypes include overcharging, overdischarging, thermal runaway, explosion, contact error, and current reduction.

In one example, the predetermined reference information is generated based on a plurality of sensing data. Thus, when the battery state estimator 330 generates the predetermined reference information, a great amount of time may be needed to generate the predetermined reference information. To avoid this, the battery state estimator 330 may receive the predetermined reference information from the external source, for example, the preprocessing apparatus, to enable the battery state estimator 330 to estimate the state of the battery using a reduced amount of time.

The battery state determiner 370 determines the state of the battery by comparing the feature vector to the data pattern for each of the normal type, the abnormal type, and the fault state type quantified in the predetermined feature space. In one example, the battery state determiner 370 determines the state of the battery by calculating a similarity between the feature vector and the data patterns in the predetermined feature space. As an example, the battery state determiner 370 calculates the similarity between the feature vector and the data pattern using a predetermined decision model, for example, a support vector machine (SVM), a classifier model, a neural network model, a decision tree model, a K-nearest neighbor model, a Gaussian process model, or any other suitable decision model known to one of ordinary skill in the art. For example, using the Gaussian process model, the battery state determiner 370 calculates a similarity between the feature vector and each of a data pattern for the normal state type, a data pattern for the abnormal state type, and a data pattern for the fault state model. Hereinafter, the data pattern for the normal state type may also be referred to as a first pattern, the data pattern for the abnormal state type may also be referred to as a second pattern, and the data pattern for the fault state model may also be referred to as a third pattern. When the first pattern has a highest similarity to the feature vector among the above patterns, the battery state determiner 370 determines the state of the battery to be a normal state.

In one example, the battery state determiner 370 calculates a value of probability that the feature vector is distributed to each of the data patterns for the battery state types, and determines a state type corresponding to a data pattern having a greatest value of probability as the state of the battery.

In another example, the battery state determiner 370 segments the data patterns for the battery state types into a plurality of areas, and determines a state type corresponding to an area having a shortest distance from the feature vector among the plurality of areas as the state of the battery.

FIG. 4 is a block diagram illustrating an example of a preprocessing apparatus 400 for estimating a state of a battery.

Referring to FIG. 4, the preprocessing apparatus 400 includes a communicator 410, an approximator 420, and a pattern information generator 460. In one example, the preprocessing apparatus 400 corresponds to the preprocessing apparatus 140 in FIG. 1.

The communicator 410 transmits and receives data to and from an external source using a wired interface or a wireless interface. The external source may be any apparatus other than the preprocessing apparatus 400. For example, the communicator 410 transmits and receives the data to and from the battery state estimation apparatus 300 of FIG. 3 using the wired interface or the wireless interface.

The approximator 420 extracts a mapping parameter for approximating a plurality of items of sensing data included in a database, and approximates the plurality of items of sensing data based on the extracted mapping parameter. The approximator 420 includes a calibrator 430, a sensing data segmenter 440, and a feature space mapper 450.

The calibrator 430 corrects a time error of each item of sensing data based on a predetermined calibration cycle as a reference. Each item of sensing data may be generated based on a different sensing cycle or at a different time and stored in the database. To this end, when a plurality of sensing values included in a plurality of items of raw sensing data do not correspond to a predetermined calibration cycle, the calibrator 430 corrects a time error of each item of raw sensing data based on the predetermined calibration cycle as a reference. For example, the calibrator 430 corrects a sampling rate for each item of raw sensing data at an equal interval based on a predetermined sampling rate. In one example, the calibrator 430 sets the predetermined calibration cycle, and transmits information on a calibration parameter such as the predetermined calibration cycle to the external source, for example, the battery state estimation apparatus, using the communicator 410.

In one example, the calibrator 430 corrects each item of raw sensing data based on a calibration scheme such as an interpolation scheme, a merging scheme, or an averaging scheme. For example, in the interpolation scheme, the calibrator 430 interpolates a plurality of sensing values based on the predetermined calibration cycle and an assumption that a plurality of sensing values included in each item of raw sensing data are linear, and sets a sensing value corresponding to the predetermined calibration cycle. As another example, when the merging scheme is used, the calibrator 430 sets a sensing value corresponding to a time most temporally adjacent, i.e., closest in time, to the predetermined calibration cycle as a sensing value corresponding to the predetermined calibration cycle. As still another example, when the averaging scheme is used, the calibrator 430 sets an average value of sensing values corresponding to times temporally adjacent to the predetermined calibration cycle as the sensing value corresponding to the predetermined calibration cycle.

In one example, the sensing data segmenter 440 segments each item of sensing data based on a segment interval, extracts a segment having a segment size from each interval corresponding to a result of the segmenting, and generates a segment vector including the extracted segment. This enables each item of sensing data to be segmented into a form of a dimension having a same size and information on a same time interval, and thus a reliability of the state of the battery estimated by a pattern information generator 460 may be improved.

When each item of the sensing data includes at least two items of data among voltage data, current data, temperature data, and pressure data, the sensing data segmenter 440 extracts segments for the at least two items of data, generates data blocks corresponding to the at least two items of data based on the extracted segments, and generates segment vectors by combining the data blocks. For example, when each item of the sensing data includes the voltage data and the temperature data, the sending data segmenter 440 segments each of the voltage data and the temperature data based on the segment interval, and extracts a segment having the segment size from each interval corresponding to a result of the segmenting. The sensing data segmenter 440 generates a voltage data block including the segment of the voltage data and a temperature data block including the segment of the temperature data, and generates segment vectors by combining the voltage data block and the temperature data block. The sensing data segmenter 440 stores the segment vectors of the plurality of sensing data in a segment database (not shown).

In one example, the sensing data segmenter 440 adjusts a segment parameter such as the segment interval and the segment size used to segment each item of the sensing data. Also, the segment interval corresponds to a time period during which the battery state estimation apparatus estimates the state of the battery. By adjusting the segment interval, the sensing data segmenter 440 adjusts a quantity of information included in the segment vector, a speed of generating the segment vector, and the time period during which the battery state estimation apparatus estimates the state of the battery.

In one example, the sensing data segmenter 440 sets the segment parameter, and also transmits information on the segment parameter to the external source, for example, the battery state estimation apparatus, using the communicator 410.

The feature space mapper 450 extracts a mapping parameter for minimizing a restore error for each item of the sensing data mapped to the predetermined feature space among a plurality of mapping parameters stored in advance. For example, the feature space mapper 450 maps each of the segment vectors stored in the segment database to the predetermined feature space based on the plurality of mapping parameters, restores each of the mapped segment vectors, and extracts the mapping parameter for minimizing the restore error for each item of the sensing data among the plurality of mapping parameters. In this case, the restore error is the difference between the restored segment vectors and the segment vectors stored in the segment database that were mapped to the predetermined feature space. As another example, the feature space mapper 450 calculates a sampling covariance with respect to the segment vectors stored in the segment database, performs Eigen decomposition, and extracts the mapping parameter for minimizing the restore error for each item of the sensing data from the plurality of mapping parameters.

In one example, the feature space mapper 450 transmits information on the extracted parameter to the external source, for example, the battery state estimation apparatus, using the communicator 410.

The feature space mapper 450 maps each of the segment vectors to the predetermined feature space based on the extracted mapping parameter. By mapping the segment vectors to the predetermined feature space, high-dimensional data is compressed into a low-dimensional orthogonal space with a small amount of data loss. Accordingly, the number of operations needed for estimating the state of the battery in the battery state estimation apparatus may be reduced.

In one example, the mapping parameter includes a reference matrix. Thus, the feature space mapper 450 maps the segment vectors to the predetermined feature space by projecting the segment vectors onto the reference matrix, and extracts a plurality of feature vectors each having a dimension corresponding to the predetermined feature space. The feature space mapper 450 stores the extracted feature vectors in a feature database. For example, the feature space mapper 450 extracts a PCA basis matrix for minimizing the restore error for each item of the sensing data from a plurality of PCA basis matrixes, and maps the segment vectors to a PCA feature space by projecting the segment vectors onto the extracted PCA basis matrix. As another example, the feature space mapper 450 extracts an LDA basis matrix for minimizing the restore error for each item of the sensing data from a plurality of LDA basis matrixes, and maps the segment vectors to an LDA feature space by projecting the segment vectors onto the extracted LDA basis matrix. As still another example, the feature space mapper 450 extracts a non-negative matrix factorization (NMF) basis matrix for minimizing the restore error for each item of the sensing data from a plurality of NMF basis matrixes, and maps the segment vectors to an NMF feature space by projecting the segment vectors onto the extracted NMF basis matrix.

The pattern information generator 460 extracts information on patterns for battery state types by modeling the feature vectors based on a predetermined model parameter. In one example, the information on the patterns includes a data pattern for each of a normal state type, an abnormal state type, and a fault state type quantified in the predetermined feature space. In another example, each of the abnormal state type and the fault state type include at least one subtype, and the information on the patterns includes a data pattern for each of the at least one subtype.

The pattern information generator 460 extracts a model parameter for minimizing an estimation error of the information on the patterns from a plurality of model parameters stored in advance. For example, the pattern information generator 460 incorporates the plurality of feature vectors stored in the feature database in training data, applies the training data to the plurality of model parameters, for example, a plurality of probability density models, and extracts model parameters corresponding to the battery state types.

The pattern information generator 460 transmits the information on the patterns to the battery state estimation apparatus using the communicator 410. Accordingly, the battery state estimation apparatus may estimate the state of the battery using a reduced amount of time.

Figure 5A:
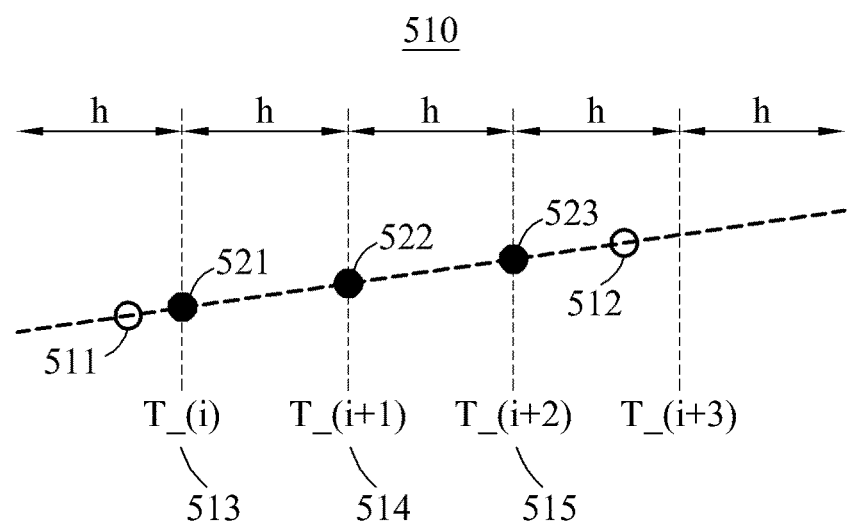
FIGS. 5A through 5C are diagrams illustrating examples of a calibration scheme.
Figure 5B:
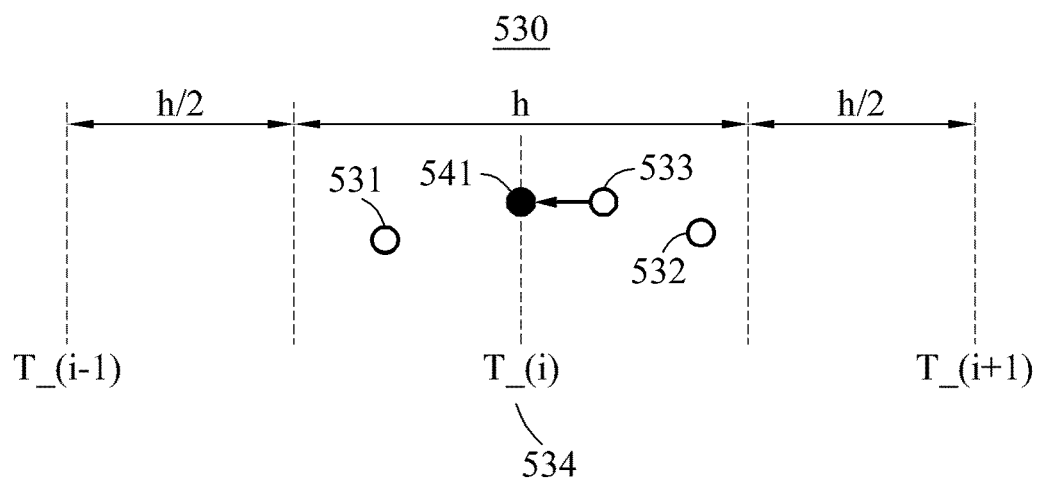
Figure 5C:
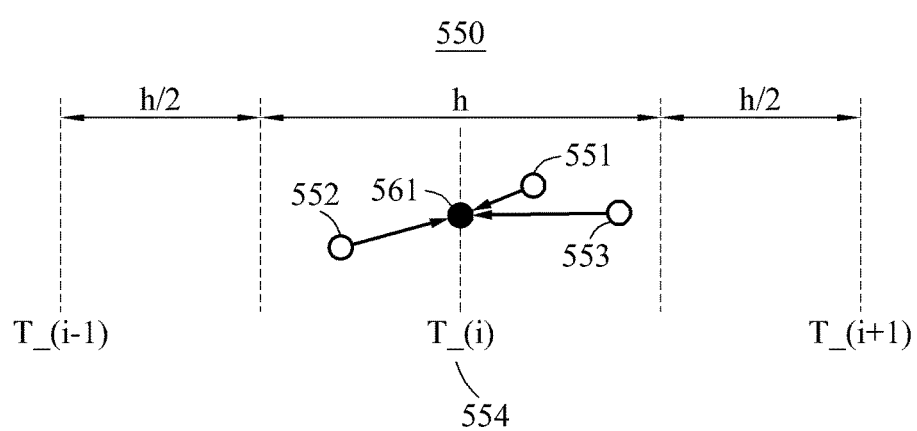

FIGS. 5A through 5C are diagrams illustrating examples of a calibration scheme.

Referring to FIGS. 5A through 5C, in graphs 510, 530, and 550, a horizontal axis represents time, and a vertical axis represents a quantity of sensing data, for example, a voltage value, a current value, a temperature value, or a pressure value.

An interpolation scheme as a calibration scheme is described with reference to the graph 510. A battery state estimation apparatus acquires a plurality of sensing values including sensing values 511 and 512 of sensing data on a battery. In this example, the sensing values 511 and 512 do not correspond to any of points in time 513 through 515 despite the fact that there should be sensing values corresponding to each of the points in time 513 through 515. Thus, the battery state estimation apparatus generates sensing values 521, 522, and 523 corresponding to each of the points in time 513 through 515 from the sensing values 511 and 512 based on the interpolation scheme. The battery state estimation apparatus estimates a linear function between the sensing values 511 and 512, thereby extracting the sensing values 521, 522, and 523 corresponding to the points in time 513 through 515. Thus, the battery state estimation apparatus modifies the sensing values 511 and 512 to obtain the sensing values 521, 522, and 523. This enables the plurality of sensing values included in the sensing data to correspond to a predetermined calibration cycle. The battery state estimation apparatus removes the sensing values 511 and 512 not corresponding to the predetermined calibration cycle from the sensing data.

A merging scheme as a calibration scheme is described with reference to the graph 530. The battery state estimation apparatus acquires a plurality of sensing values included in the sensing data on the battery from a sensor. In this example, the plurality of sensing values, for example, sensing values 531, 532, and 533, are present in a single time interval, while a single sensing value should be present in the single time interval. In this example, the battery state estimation apparatus selects the sensing value 533 corresponding to a time temporally adjacent, i.e., closest in time, to a predetermined calibration cycle from the sensing values 531, 532, and 533 present in the single time interval based on the merging scheme. This enables the battery state estimation apparatus to set the sensing value 533 as a sensing value 541 corresponding to a point in time 534 based on the predetermined calibration cycle. The battery state estimation apparatus removes the sensing values 531, 532, and 533 not corresponding to the predetermined calibration cycle from the sensing data.

An average scheme as a calibration scheme is described with reference to the graph 550. Although a single sensing value should be present in a single time interval, sensing values 551, 552, and 553 included in the sensing data on the battery acquired by a sensor are present in the single time interval. In this example, the battery state estimation apparatus calculates an average value of a plurality of sensing values, for example, the sensing values 551, 552, and 553 present in the single time interval based on the average scheme, and sets the average value of the sensing values 551, 552, and 553 as a sensing value 561 corresponding to a point in time 554 based on the predetermined calibration cycle. The battery state estimation apparatus removes the sensing values 551, 552, and 553 not corresponding to the predetermined calibration cycle from the sensing data.

FIG. 6 is a diagram illustrating an example of calibration.

Referring to FIG. 6, in a histogram 610, a horizontal axis represents a sampling rate, and a vertical axis represents a frequency. The histogram 610 indicates a sampling rate of raw sensing data provided before a battery information estimation apparatus performs calibration. In the histogram 610, the sampling rate of the raw sensing data varies around a sampling rate of ten seconds. In this example, the battery state estimation apparatus performs calibration on the raw sensing data by setting a ten-second calibration cycle.

In a histogram 620, a horizontal axis represents a sampling rate and a vertical axis represents a number of items of sensing data. The histogram 620 indicates the number of items of sensing data on which calibration is performed based on a ten-second calibration cycle. As indicated in the histogram 620, the sensing data calibrated by the battery state estimation apparatus is corrected based on a sampling rate of ten seconds by performing a calibration scheme, such as an interpolation scheme, a merging scheme, or an average scheme.

Figure 7:
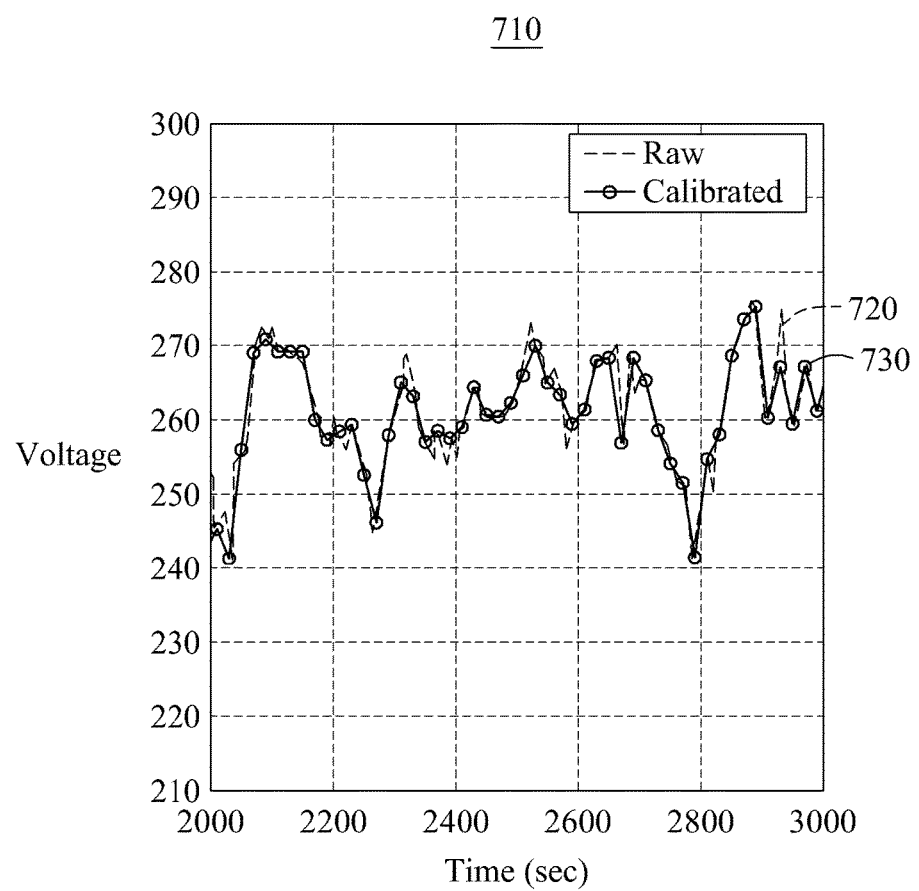
FIG. 7 is a diagram illustrating another example of calibration.

FIG. 7 is a diagram illustrating another example of calibration.

Referring to FIG. 7, a graph 710 shows raw sensing data 720 and calibrated sensing data 730. In the graph 710, a horizontal axis represents time and a vertical axis represents a magnitude of a voltage.

Based on states of sensors for sensing a battery or a state of a network among the sensors, a plurality of sensing values included in the raw sensing data 720 do not correspond to a predetermined calibration cycle or a predetermined sampling rate, which causes a reliability of a result value estimated in a battery state estimation apparatus to be degraded. Thus, the battery state estimation apparatus calibrates the raw sensing data 720 based on a predetermined calibration cycle by performing a calibration scheme, such as an interpolation scheme, a merging scheme, or an average scheme.

In one example, the battery state estimation apparatus adjusts a calibration cycle. For example, a sampling rate of the raw sensing data 720 is ten seconds. In this example, although the sampling rate is changed to 20 seconds, a performance of the battery state estimation apparatus is not degraded. Accordingly, the battery state estimation apparatus calibrates the raw sensing data 720 by setting the calibration cycle to 20 seconds. As indicated in the graph 710, a quantity of the calibrated sensing data is reduced compared to the sensing data 720, and thus a number of operations that are performed in the battery state estimation apparatus is reduced.

Figure 8A:
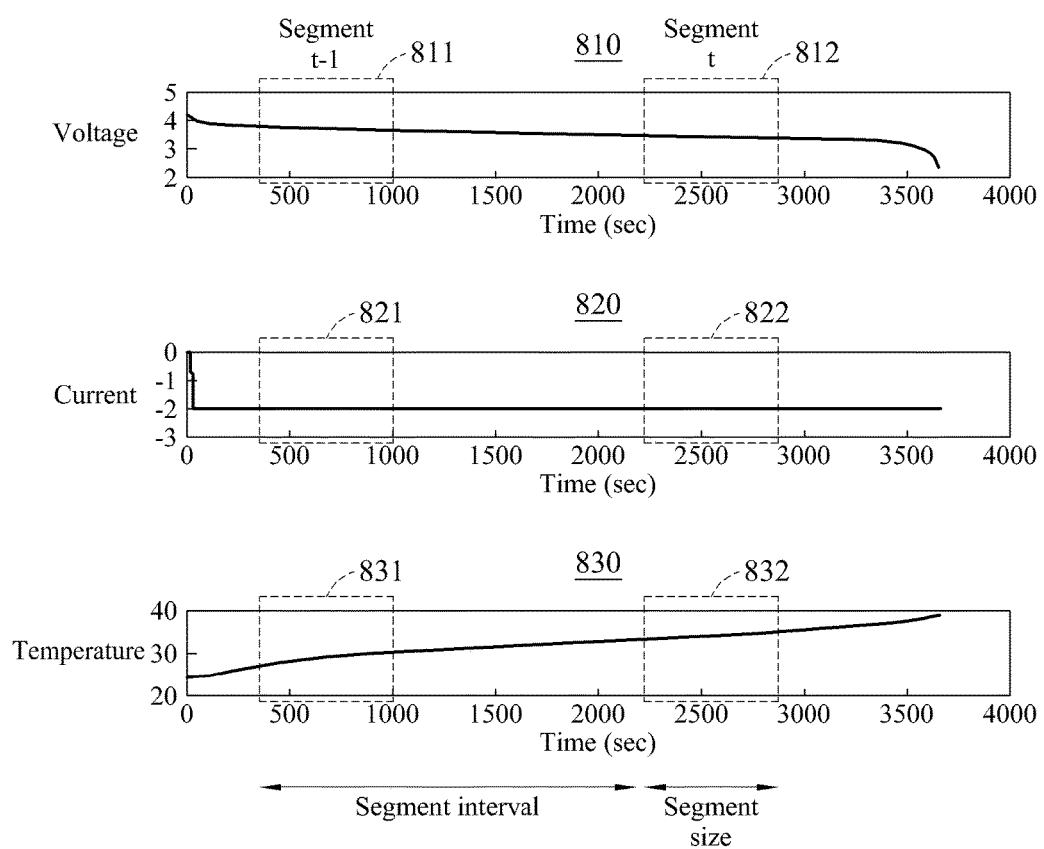
FIGS. 8A through 8B are diagrams illustrating an example of generating a segment vector.
Figure 8B:
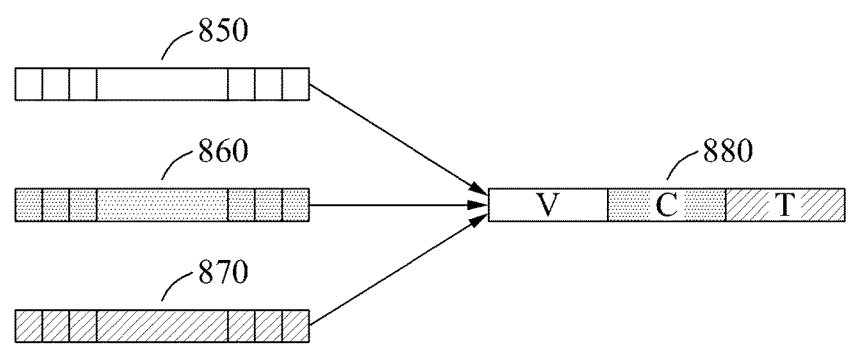

FIGS. 8A through 8B are diagrams illustrating an example of generating a segment vector.

Referring to FIG. 8A, a graph 810 indicates voltage data, a graph 820 indicates current data, and a graph 830 indicates temperature data. In the graphs 810, 820, and 830, a horizontal axis represents time. A vertical axis of the graph 810 represents a magnitude of voltage, a vertical axis of the graph 820 represents a magnitude of current, and a vertical axis of the graph 830 represents a temperature.

In this example, a battery state estimation apparatus segments each of the voltage data, the current data, and the temperature data based on a segment interval and a segment size for each interval, thereby extracting voltage segments 811 and 812, current segments 821 and 822, and temperature segments 831 and 832. In this example, the segment interval and the segment size are set in advance. This enables each of the voltage segment 811, the current segment 821, and the temperature segment 831 to have information on a same time interval and a dimension of a same size, and each of the voltage segment 812, the current segment 822, and the temperature segment 832 to have information on a same time interval and a dimension of a same size. Based, for example, on the voltage segment 811, the current segment 821, and the temperature segment 831, the battery state estimation apparatus generates a voltage data block 850, a current data block 860, and a temperature data block 870 provided based on a unit of a segment to correspond to, for example, the voltage segment 811, the current segment 821, and the temperature segment 831, respectively. The battery state estimation apparatus generates a single segment vector 880 by combining the voltage data block 850, the current data block 860, and the temperature data block 870. Subsequently, the battery state estimation apparatus estimates a state of the battery based on the segment vector 880 as a basic unit.

Figure 9A:
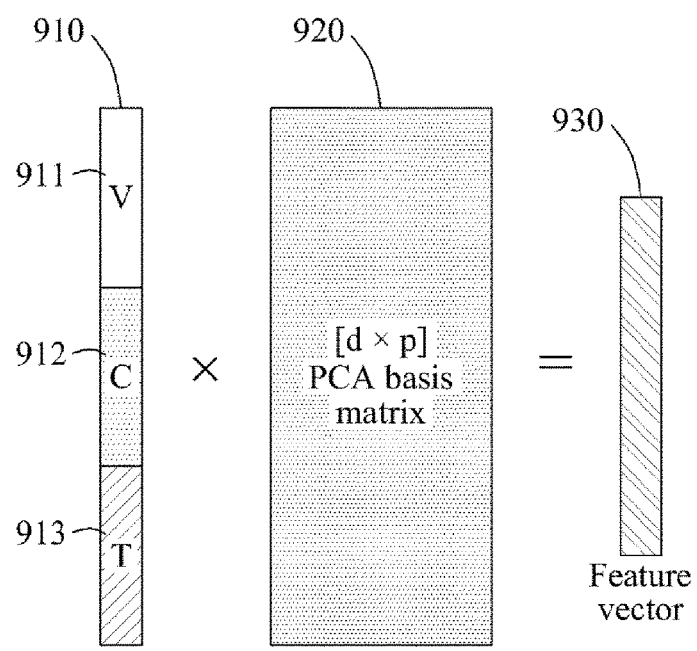
FIGS. 9A and 9B are diagrams illustrating examples of mapping to a feature space.
Figure 9B:
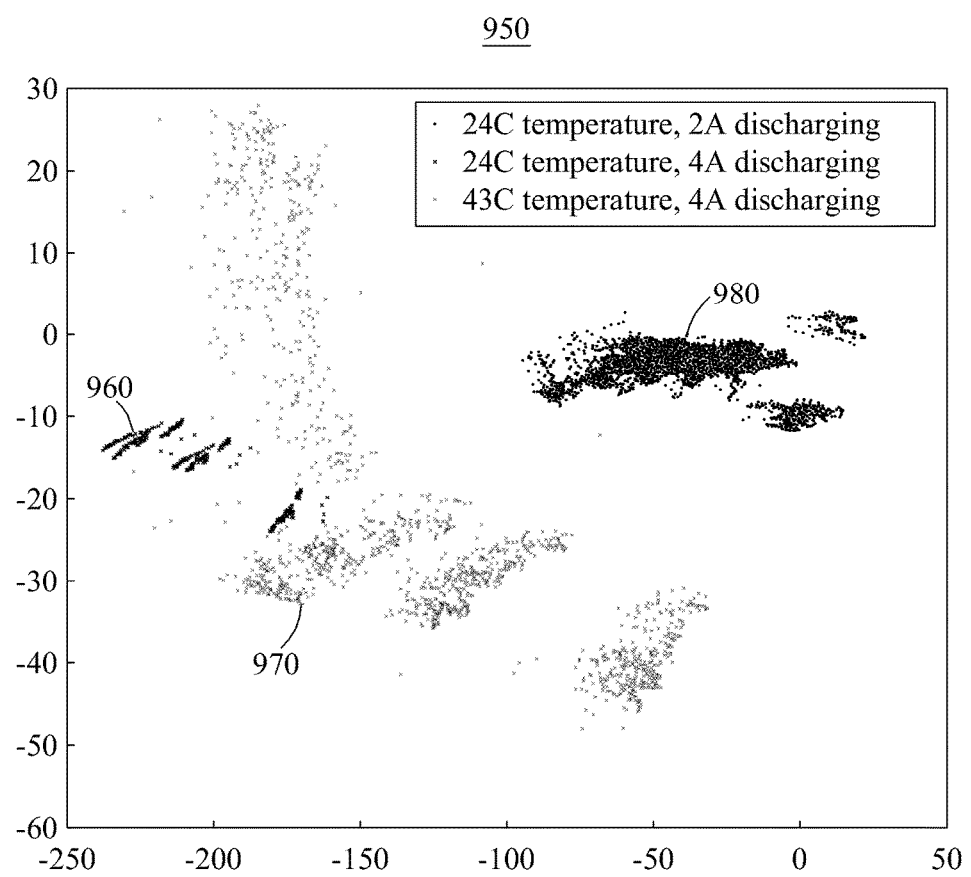

FIGS. 9A and 9B are diagrams illustrating examples of mapping to a feature space.

Referring to FIG. 9A, a battery state estimation apparatus maps a segment vector 910 to a predetermined feature space based on a predetermined mapping parameter. The segment vector 910 has a dimension d, and includes a voltage data block 911 for voltage data, a current data block 912 for current data, and a temperature data block 913 for temperature data. In one example, the predetermined mapping parameter is a PCA basis matrix 920. The PCA basis matrix has dimensions d×p. d is the dimension of the segment vector 910, and p is a dimension of a feature vector of the predetermined feature space. The segment vector 910 having the dimension d is projected onto the PCA basis matrix 920 and converted into a feature vector having a dimension p in the predetermined feature space through the projection. As an example, a preprocessing apparatus extracts the PCA basis matrix 920 for minimizing a restore error of the segment vector 910 from a plurality of PCA basis matrixes, and transmit information on the extracted PCA basis matrix 920 to the battery state estimation apparatus. When the battery state estimation apparatus does not extract the PCA basis matrix 920 from the plurality of PCA basis matrixes itself, but receives the PCA basis matrix 920 from the preprocessing apparatus, a number of operations performed in the battery state estimation apparatus is reduced.

The battery state estimation apparatus projects the segment vector 910 onto the PCA basis matrix 920 to map the segment vector 910 to a PCA feature space, thereby extracting a feature vector 930. In this example, the feature vector 930 has a dimension p, wherein p<<d. This process converts the segment vector 910 from a high dimension to a low dimension, and thus reducing a number of operations needed for estimating a state of the battery in the battery state estimation apparatus.

Referring to FIG. 9B, a preprocessing apparatus extracts a mapping parameter for minimizing a restore error of a plurality of items of sensing data mapped to a predetermined feature space from a plurality of mapping parameters stored in advance. The preprocessing apparatus maps a plurality of segment vectors to the predetermined feature space based on the extracted mapping parameter. For example, the preprocessing apparatus acquires a plurality of items of voltage data, current data, and temperature data obtained by sensing a lithium-ion battery in a normal state, and extracts the plurality of segment vectors from the plurality of items of voltage data, current data, and temperature data. In this example, a number of segment vectors is 23570, the plurality of segment vectors have 180 dimensions, and a segment size of the plurality of segment vectors is 11 minutes. The preprocessing apparatus extracts a PCA basis matrix for minimizing the restore error of the plurality of items of sensing data from a plurality of PCA basis matrixes, and projects the plurality of segment vectors onto the extracted PCA basis matrix, thereby mapping the plurality of segment vectors to a two-dimensional PCA space 950. In this example, the plurality of segment vectors are converted into feature vectors in the two-dimensional PCA space 950, and the feature vectors are grouped in the two-dimensional PCA space 950. For example, in the two-dimensional PCA space 950, the feature vectors are classified into a first group 960, a second group 970, and a third group 980. The first group 960 includes feature vectors corresponding to sensing data sensed when a temperature of the lithium-ion battery is 24° C. and a magnitude of discharging current is two amperes (A). The second group 970 includes feature vectors corresponding to sensing data sensed when the temperature of the lithium-ion battery is 24° C. and the magnitude of discharging current is 4 A. The third group 980 includes feature vectors corresponding to sensing data sensed when the temperature of the lithium-ion battery is 43° C. and the magnitude of discharging current is 4 A. Based on a property that the feature vectors are classified into a plurality of groups in the two-dimensional PCA space 950, the preprocessing apparatus extracts information on patterns for battery state types by modeling a plurality of feature vectors based on a predetermined model parameter.

Figure 10:
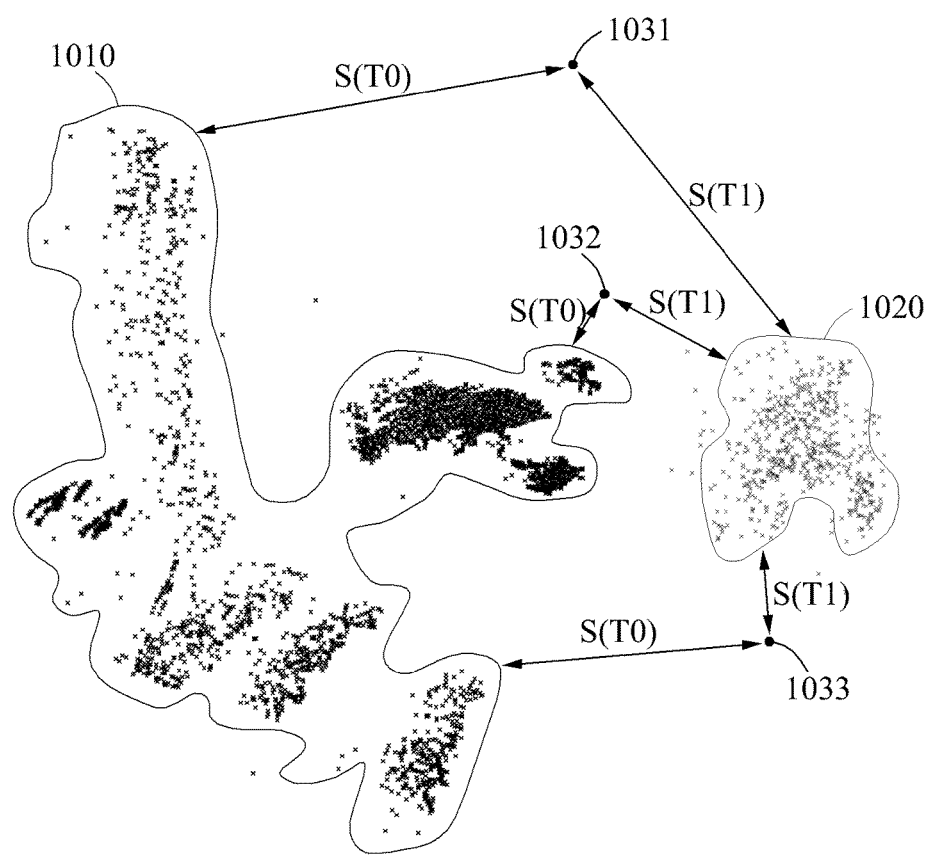
FIG. 10 is a diagram illustrating an example of estimating a state of a battery.

FIG. 10 is a diagram illustrating an example of estimating a state of a battery.

Referring to FIG. 10, a preprocessing apparatus extracts a plurality of segment vectors from a plurality of items of sensing data, and projects the plurality of segment vector onto a PCA basis matrix to map the plurality of segment vectors to a PCA space. Accordingly, the plurality of segment vectors are converted into a plurality of feature vectors in the PCA space. The preprocessing apparatus extracts information on patterns for battery state types by modeling the plurality of feature vectors based on a predetermined model parameter. In FIG. 10, a first pattern 1010 corresponds to a normal state type, and a second pattern 1020 corresponds to a first abnormal state type, for example, an abnormal state type caused by overcharging. The preprocessing apparatus transmits the information on the patterns for the battery state types to a battery state estimation apparatus.

The battery state estimation apparatus extracts a segment vector from sensing data acquired from a sensor for sensing the battery, and extracts a feature vector by mapping the segment vector to a predetermined feature space. The battery state estimation apparatus estimates the state of the battery by comparing the feature vector to the information on the patterns for the battery state types acquired from the preprocessing apparatus. In one example, the battery state estimation apparatus determines the state of the battery by calculating a similarity between the feature vector and each of the first pattern 1010 and the second pattern 1020. In one example, a similarity S(T0) between a feature vector 1031 and the first pattern 1010 and a similarity S(T1) between the feature vector 1031 and the second pattern 1020 are both less than a predetermined threshold. In this example, the battery state estimation apparatus determines a state of the battery corresponding to the feature vector 1031 to be a predetermined abnormal state other than the normal state and the first abnormal state. In another example, a similarity S(T0) between a feature vector 1032 and the first pattern 1010 and a similarity S(T1) between feature vector 1032 and the second pattern 1020 are both greater than the predetermined threshold, and the similarity S(T0) between the feature vector 1032 and the first pattern 1010 is higher than the similarity S(T1) between the feature vector 1032 and the second pattern 1020. In this example, the battery state estimation apparatus determines a state of the battery corresponding to the feature vector 1032 to be the normal state.

In still another example, a similarity S(T0) between a feature vector 1033 and the first pattern 1010 and a similarity S(T1) between the feature vector 1033 and the second pattern 1020 are both greater than the predetermined threshold, and the similarity S(T0) between the feature vector 1033 and the first pattern 1010 is lower than the similarity S(T1) between the feature vector 1033 and the second pattern 1020. In this example, the battery state estimation apparatus determines a state of the battery corresponding to the feature vector 1033 to be the first abnormal state.

Figure 11:
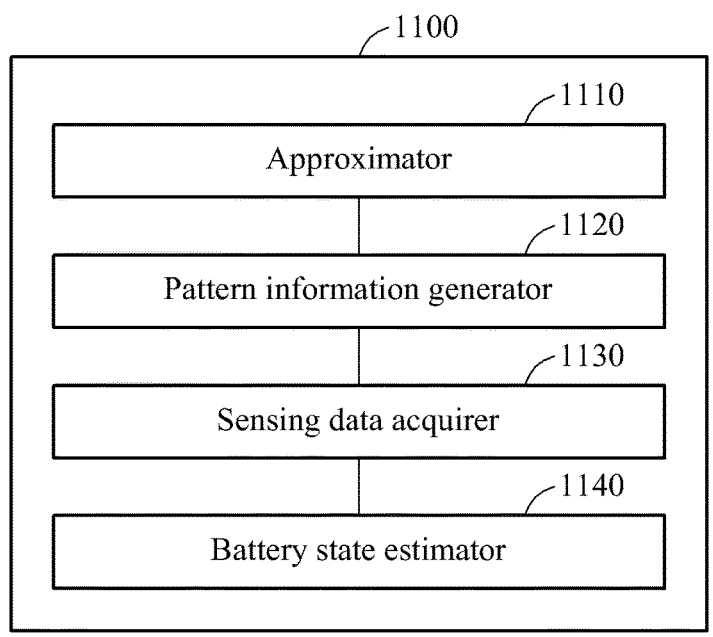
FIG. 11 is a block diagram illustrating another example of a battery state estimation apparatus.

FIG. 11 is a block diagram illustrating another example of a battery state estimation apparatus 1100.

Referring to FIG. 11, the battery state estimation apparatus 1100 includes an approximator 1110, a pattern information generator 1120, a sensing data acquirer 1130, and a battery state estimator 1140.

The approximator 1110 extracts a mapping parameter for approximating a plurality of items of sensing data included in a database, and approximates the plurality of items of sensing data based on the extracted mapping parameter.

The pattern information generator 1120 generates information on patterns for battery state types based on a result of the approximating.

The sensing data acquirer 1130 acquires sensing data on the battery.

The battery state estimator 1140 approximates the sensing data acquired from the sensing data acquirer 1130, and extracts a state of the battery by comparing the approximated sensing data to the information on the patterns for the battery state types.

Detailed descriptions with respect to the battery state estimation apparatus 1100 of FIG. 11 have been omitted for increased clarity and conciseness because the descriptions provided with reference to FIGS. 1 through 10 are also applicable to the battery state estimation apparatus 1100 of FIG. 11.

Figure 12:
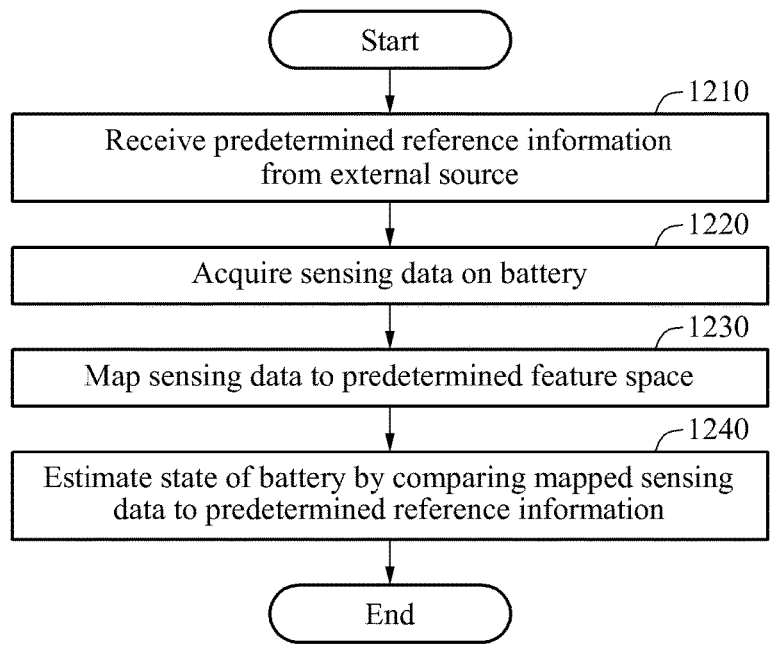
FIG. 12 is a flowchart illustrating an example of a battery state estimation method.

FIG. 12 is a flowchart illustrating an example of a battery state estimation method.

Referring to FIG. 12, in operation 1210, a battery state estimation apparatus receives predetermined reference information from an external source.

In operation 1220, the battery state estimation apparatus acquires sensing data on a battery.

In operation 1230, the battery state estimation apparatus maps the sensing data to a predetermined feature space.

In operation 1240, the battery state estimation apparatus estimates a state of the battery by comparing the mapped sensing data to the predetermined reference information.

Detailed descriptions with respect to the battery state estimation method of FIG. 12 have been omitted for increased clarity and conciseness because the descriptions provided with reference to FIGS. 1 through 10 are also applicable to the battery state estimation method of FIG. 12.

Figure 13:
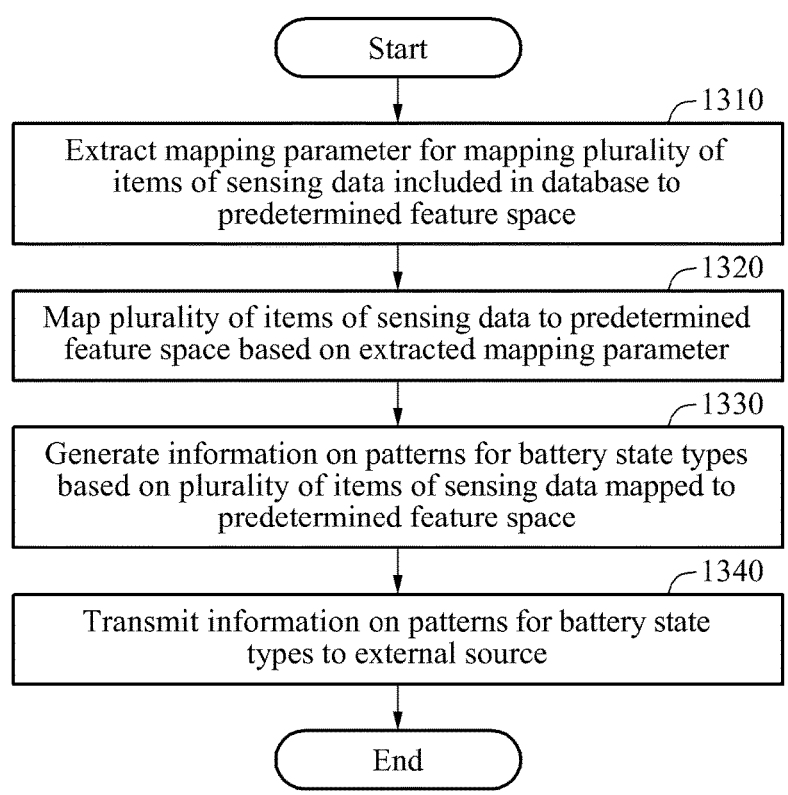
FIG. 13 is a flowchart illustrating an example of a preprocessing method of estimating a state of a battery.

FIG. 13 is a flowchart illustrating an example of a preprocessing method of estimating a state of a battery.

Referring to FIG. 13, in operation 1310, a preprocessing apparatus extracts a mapping parameter for mapping a plurality of items of sensing data included in a database to a predetermined feature space.

In operation 1320, the preprocessing apparatus maps the plurality of items of sensing data to the predetermined feature space based on the extracted mapping parameter.

In operation 1330, the preprocessing apparatus generates information on patterns for battery state types based on the plurality of items of sensing data mapped to the predetermined feature space.

In operation 1340, the preprocessing apparatus transmits the information on the patterns for the battery state types to an external source.

Detailed descriptions with respect to the preprocessing method of estimating the state of the battery of FIG. 13 have been omitted for increased clarity and conciseness because the descriptions provided with reference to FIGS. 1 through 10 are also applicable to the preprocessing method of estimating the state of the battery of FIG. 13.

FIG. 14 is a flowchart illustrating another example of a battery state estimation method.

Referring to FIG. 14, in operation 1410, a battery state estimation apparatus extracts a mapping parameter for mapping a plurality of items of sensing data included in a database to a predetermined feature space.

In operation 1420, the battery state estimation apparatus maps the plurality of items of sensing data to the predetermined feature space based on the extracted mapping parameter.

In operation 1430, the battery state estimation apparatus generates information on patterns for battery state types based on the plurality of items of sensing data mapped to the predetermined feature space.

In operation 1440, the battery state estimation apparatus acquires sensing data on the battery.

In operation 1450, the battery state estimation apparatus maps the sensing data acquired from a sensing data acquirer to the predetermined feature space.

In operation 1460, the battery state estimation apparatus estimates a state of the battery by comparing the mapped sensing data to the information on the patterns of the battery state types.

Detailed descriptions with respect to the battery state estimation method of FIG. 14 have been omitted for increased clarity and conciseness because the descriptions provided with reference to FIGS. 1 through 10 are also applicable to the battery state estimation method of FIG. 14.

The battery control apparatus 130 and the preprocessing apparatus 140 in FIG. 1, the battery state estimation apparatus 300, the communicator 310, the sensing data acquirer 320, the battery state estimator 330, the calibrator 340, the sensing data segmenter 350, the feature space mapper 360, and the battery state determiner 370 in FIG. 3, the preprocessing apparatus 400, the communicator 410, the approximator 420, the calibrator 430, the sensing data segmenter 440, the feature space mapper 450, and the pattern information generator 460 in FIG. 4, and the battery state estimation apparatus 1100, the approximator 1110, the pattern information generator 1120, the sensing data acquirer 1130, and the battery state estimator 1140 that perform the operations described herein with respect to FIGS. 1-14 are implemented by hardware components. Examples of hardware components include controllers, sensors, generators, communication modules, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-14. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 12-14 that perform the operations described herein with respect to FIGS. 1-14 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery state estimation apparatus comprising:
a sensing data acquirer configured to acquire sensing data on a battery; and
a battery state estimator configured to:
extract segments from the sensing data;
generate a segment vector by merging the segments;

obtain a feature vector by mapping the segment vector to a battery state space, wherein the battery state space comprises an area corresponding to each of battery state types; and estimate a state of the battery based on a distribution of the feature vector in the battery state space.

2. The apparatus of claim 1, wherein the battery state estimator comprises a sensing data segmenter configured to segment the sensing data based on a predetermined time interval, extract a segment having a predetermined size from each time interval.

3. The apparatus of claim 1, wherein the battery state estimator further comprises a calibrator configured to correct a time error of the sensing data, using a determined calibration scheme, based on a predetermined calibration cycle as a reference, and wherein the determined calibration scheme includes an interpolation scheme, a merging scheme, and an averaging scheme.

4. The apparatus of claim 1, wherein the battery state estimator further comprises a feature space mapper configured to map the segment vector to the battery state space based on a predetermined mapping parameter.

5. The apparatus of claim 4, wherein the predetermined mapping parameter comprises a predetermined reference matrix; and the feature space mapper is further configured to project the segment vector onto the predetermined reference matrix to extract the feature vector having a dimension corresponding to the battery state space.

6. The apparatus of claim 5, wherein the predetermined reference information comprises information on patterns for the battery state types in the battery state space; and the battery state estimator further comprises a battery state determiner configured to determine the state of the battery by comparing the feature vector to the information on the patterns.

7. The apparatus of claim 6, wherein the battery state types comprise a normal state type, an abnormal state type, and a fault state type; and each of the abnormal state type and the fault state type comprises at least one subtype.

8. The apparatus of claim 6, wherein the battery state determiner is further configured to calculate a similarity between the feature vector and each of the patterns in the battery state space, and determine the state of the battery based on a comparison between the calculated similarities.

9. A processor-implemented method of estimating a state of a battery, the method comprising:

acquiring sensing data on a battery;
extracting segments from the sensing data;
generating a segment vector by merging the segments;
obtaining a feature vector by mapping the segment vector to a battery state space, wherein the battery state space comprises an area corresponding to each of battery state types; and estimating the state of the battery based on a distribution of the feature vector in the battery state space.

10. The method of claim 9, wherein the extracting comprises:

segmenting the sensing data based on a predetermined time interval; and extracting a segment having a predetermined size from each time interval.

11. The method of claim 9, further comprises correcting a time error of the sensing data, using a determined calibration scheme, based on a predetermined calibration cycle as a reference, and wherein the determined calibration scheme includes an interpolation scheme, a merging scheme, and an averaging scheme.

12. The method of claim 9, wherein the mapping comprises mapping the segment vector to the battery state space based on a predetermined mapping parameter.

13. The method of claim 12, wherein the predetermined mapping parameter comprises a predetermined reference matrix; and the mapping comprises projecting the segment vector onto the predetermined reference matrix to extract the feature vector having a dimension corresponding to the battery state space.

14. The method of claim 13, wherein the predetermined reference information comprises information on patterns for the battery state types in the battery state space; and the estimating further comprises determining the state of the battery by comparing the feature vector to the information on the patterns.

15. The method of claim 14, wherein the battery state types comprise a normal state type, an abnormal state type, and a fault state type; and each of the abnormal state type and the fault state type comprises at least one subtype.

16. The method of claim 14, wherein the determining comprises:

calculating a similarity between the feature vector and each of the patterns in the battery state space; and determining the state of the battery based on a comparison between the calculated similarities.

17. A non-transitory computer-readable storage medium storing instructions for causing computing hardware to perform the method of claim 9.

* * * * *